United States Patent
Takenoshita et al.

(10) Patent No.: US 9,035,721 B2
(45) Date of Patent: May 19, 2015

(54) DUPLEXER, COMMUNICATION MODULE COMPONENT, AND COMMUNICATION DEVICE

(75) Inventors: Takeshi Takenoshita, Kyoto (JP); Yuuko Yokota, Kyoto (JP); Yuuji Mori, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 547 days.

(21) Appl. No.: 13/056,633

(22) PCT Filed: Jul. 30, 2009

(86) PCT No.: PCT/JP2009/063578
§ 371 (c)(1),
(2), (4) Date: Jan. 28, 2011

(87) PCT Pub. No.: WO2010/013778
PCT Pub. Date: Feb. 4, 2010

(65) Prior Publication Data
US 2011/0193650 A1  Aug. 11, 2011

(30) Foreign Application Priority Data

Jul. 30, 2008 (JP) ................................ 2008-196069
May 28, 2009 (JP) ................................ 2009-129399

(51) Int. Cl.
*H03H 9/58* (2006.01)
*H03H 9/05* (2006.01)
*H03H 9/72* (2006.01)
(Continued)

(52) U.S. Cl.
CPC ............. *H03H 9/0576* (2013.01); *H03H 9/725* (2013.01); *H03H 2001/0085* (2013.01)

(58) Field of Classification Search
CPC .......... H03H 9/72; H03H 9/725; H03H 9/703; H03H 9/706; H03H 9/0028; H03H 9/0038; H03H 9/0095; H03H 9/64; H03H 6/6433; H03H 9/6483
USPC .......................... 333/133, 187, 189, 193, 195
See application file for complete search history.

(56) References Cited

U.S. PATENT DOCUMENTS 7,102,460 B2 *  9/2006  Schmidhammer et al. ... 333/133
7,187,253 B2 *  3/2007  Sano et al. ..................... 333/187

(Continued)

FOREIGN PATENT DOCUMENTS

CN  1756076 A  4/2006
JP  05-183380  7/1993
(Continued)

OTHER PUBLICATIONS

Office Action dated Feb. 11, 2015 issued in counterpart Chinese Application 2009-80129520.X.

*Primary Examiner* — Dean Takaoka
(74) *Attorney, Agent, or Firm* — Procopio, Cory, Hargreaves & Savitch LLP

(57) ABSTRACT

A duplexer has an antenna terminal, a first terminal, and second terminals and provided with a first filter arranged between the antenna terminal and first terminal and including a parallel resonator for forming a ladder type filter circuit, a second filter arranged between the antenna terminal and the second terminal and having a passband higher than a passband of the first filter, and an electromagnetic coupling element arranged between the parallel resonator of the first filter and a ground part and electromagnetically coupled with the antenna terminal.

8 Claims, 19 Drawing Sheets

(51) Int. Cl.
*H03H 7/42* (2006.01)
*H03H 1/00* (2006.01)

(56) References Cited

U.S. PATENT DOCUMENTS

| | | | | |
|---|---|---|---|---|
| 7,446,629 B2 * | 11/2008 | Nakamura et al. | ............ | 333/133 |
| 7,466,629 B1 * | 12/2008 | Bustamante et al. | ......... | 367/134 |
| 7,498,899 B2 * | 3/2009 | Iwaki et al. | ................... | 333/133 |
| 7,573,354 B2 * | 8/2009 | Nishihara et al. | ............ | 333/133 |
| 7,808,935 B2 * | 10/2010 | Koga et al. | ................... | 370/282 |
| 8,367,941 B2 * | 2/2013 | Tsutsumi et al. | ............. | 174/260 |
| 2004/0090287 A1 * | 5/2004 | Fujino et al. | ................ | 333/133 |
| 2006/0028298 A1 | 2/2006 | Nakamura et al. | ............ | 333/133 |
| 2006/0066419 A1 | 3/2006 | Iwaki et al. | | |
| 2008/0136555 A1 * | 6/2008 | Schmidhammer | ............ | 333/129 |
| 2009/0147707 A1 | 6/2009 | Koga et al. | .................... | 370/282 |

FOREIGN PATENT DOCUMENTS

| | | |
|---|---|---|
| JP | 2005-175638 | 6/2005 |
| JP | 2006-074749 | 3/2006 |
| WO | WO 2007/102560 A1 | 9/2007 |

* cited by examiner

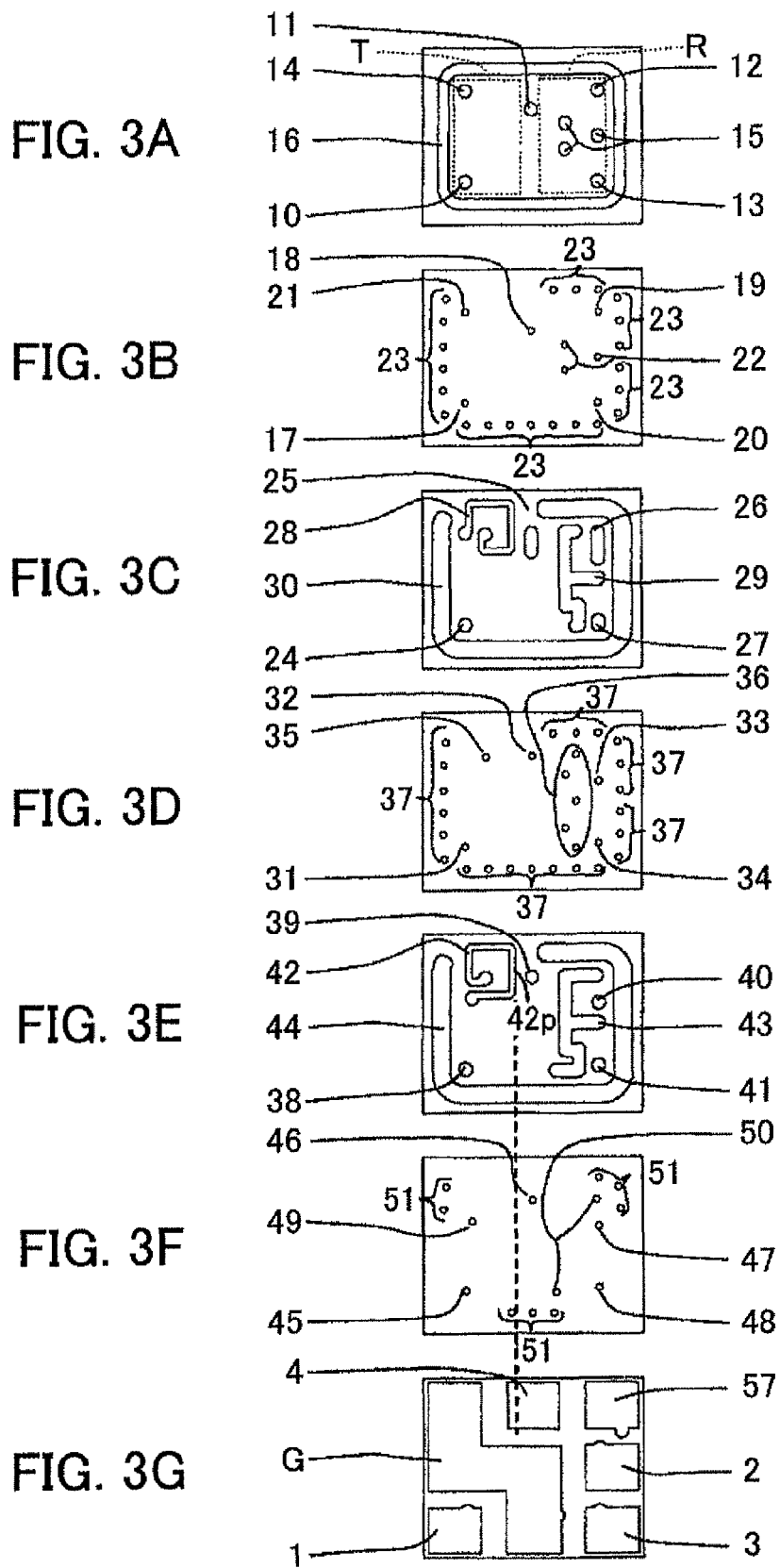

FIG. 4C

DUPLEXER, COMMUNICATION MODULE COMPONENT, AND COMMUNICATION DEVICE

CROSS-REFERENCE TO THE RELATED APPLICATIONS

This application is a national stage of international application No. PCT/JP2009/063578, filed on Jul. 30, 2009, and claims the benefit of priority under 35 USC 119 to Japanese Patent Application No. 2008-196069, filed on Jul. 30, 2008 and Japanese Patent Application No. 2009-129399, filed on May 28, 2009, the entire contents of all of which are incorporated herein by reference.

TECHNICAL FIELD

The present invention relates to a duplexer, a communication module component, and a communication device.

BACKGROUND ART

At a front end section of a communication terminal such as a mobile phone or the like, use is made of a duplexer that separates the transmission and reception frequencies.

A duplexer has an antenna terminal, a transmitting terminal, and a receiving terminal. A transmitting filter is arranged between the antenna terminal and the transmitting terminal, while a receiving filter is arranged between the antenna terminal and the receiving terminal. In a communication terminal, a transmitting circuit and a receiving circuit are arranged after the duplexer. The duplexer has a function of branching a transmission signal from the transmitting circuit to the antenna terminal and branching a reception signal received at the antenna terminal to the receiving circuit.

In such a duplexer, the transmitting filter and the receiving filter are matched in order to prevent the transmission signal from flowing into the receiving circuit or to prevent the reception signal from flowing into the transmitting circuit.

However, depending on the individual filter design, even in a state where the best match is obtained, for example, sometimes the impedance to the receiving filter becomes slightly lower than the impedance from the transmitting filter to the antenna or sometimes the impedance to the transmitting filter becomes slightly lower than the impedance from the antenna to the receiving filter. In this case, the signal which inherently should pass from the transmitting filter to the antenna will flow to the receiving filter, or the signal which should have been input from the antenna to the receiving filter will flow to the transmitting filter, so the isolation characteristic is deteriorated.

The transmitting filter and receiving filter used in a duplexer are frequently configured by surface acoustic wave filters with IDT electrodes formed on piezoelectric substrates. In a conventional duplexer, the isolation characteristic was improved by adjusting the impedance of the each filter by changing the distances between electrode fingers of the IDT electrodes or the numbers of electrode fingers (see, for example, Patent Literature 1).

In this regard, as required specifications demanded from a duplexer, other than the isolation characteristic, the attenuation characteristic has become important as well. This is because deterioration of the quality of speech of a mobile phone and other problems occur if either characteristic of the isolation characteristic and attenuation characteristic is poor. With the conventional adjustment methods, however, the adjustable range was limited, so it was difficult to satisfy required specifications of the isolation characteristic and attenuation characteristic together.

The present invention was made in order to solve the above problems and provides a duplexer capable of improving the isolation characteristic and attenuation characteristic and a communication device using the same.

Patent Literature 1; Japanese Patent Publication (A) No. 5-183380

SUMMARY OF INVENTION

A duplexer according to an embodiment of the present invention has a ladder type first filter positioned between an antenna terminal and a first terminal and having a parallel resonator; a second filter positioned between the antenna terminal and a second terminal and having a passband higher than a passband of the first filter; and a first electromagnetic coupling element positioned between the parallel resonator of the first filter and a ground part and electromagnetically coupled with the antenna terminal.

Alternatively, a duplexer according to an embodiment of the present invention has a circuit board; an antenna terminal, a first terminal, a second terminal, and a ground part which are positioned on a first surface of the circuit board; a piezoelectric substrate mounted on a second surface of the circuit board opposite to the first surface; a ladder type first filter which is positioned on a mount surface of the piezoelectric substrate for mounting on the circuit board and has a parallel resonator; a second filter positioned on the mount surface of the piezoelectric substrate and having a passband higher than a passband of the first filter; and a first conductor provided on the circuit board, connected at one end to the parallel resonators, and connected at the other end to the ground part, wherein a portion of the first conductor and the antenna terminal are arranged so that another conductor is not interposed between the two.

Further, a communication module component according to an embodiment of the present invention has a duplexer as set forth in either of the above.

A communication device according to an embodiment of the present invention has a duplexer as set forth, in either of the above.

According to the above duplexers, first, a signal passing through the first filter drops to the ground by the electromagnetic coupling element so as to have an attenuation pole in the passband of the second filter. In the past, a signal which did not completely drop to the ground was generated. This became a cause of deterioration of the isolation characteristic or attenuation characteristic. In the case of the duplexers of the present, invention, however, the electromagnetic coupling element is electromagnetically coupled with the antenna terminal, therefore a route for passage of the signal is formed between the electromagnetic coupling element and the antenna terminal, and a signal which has not completely dropped to the ground can be dropped to the antenna terminal through this route. Accordingly, the isolation characteristic and the attenuation characteristic are improved together, and it becomes possible to achieve a duplexer excellent in electrical characteristics.

Further, by applying such a duplexer to a communication module component, an electronic module component excellent in electrical characteristics can be achieved.

Further, by applying such a duplexer to a communication device, a communication device excellent in quality of speech can be achieved.

BRIEF DESCRIPTION OF DRAWINGS

[FIG. 3] Views showing a modification of the circuit board shown in FIG. 1.

[FIG. 12] Views showing a communication module component according to the first embodiment of the present invention, in which

MODE FOR CARRYING OUT THE INVENTION

Figure 1:
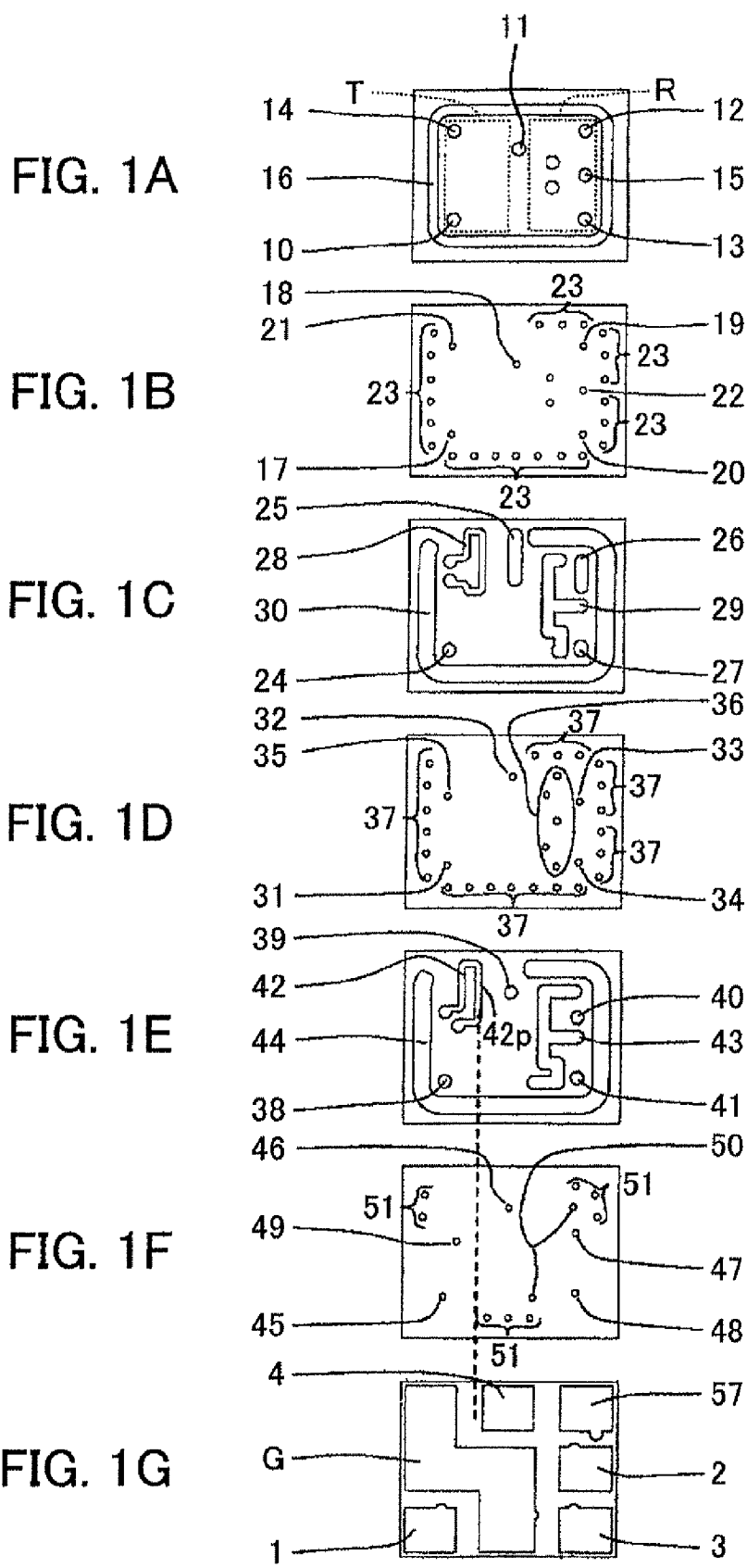
[FIG. 1] Views showing pattern layouts and via layouts of layers of a circuit board forming part of a duplexer according to a first embodiment of the present invention.

Below, embodiments of a duplexer according to the present invention are explained in detail with reference to the drawings. Note that, in the drawings explained below, the same notations are attached to the same portions. Further, the size of each pattern, the distance between patterns or the like, or the number, diameter, shape or the like of vias are schematically shown for explanation, therefore, the present invention is not limited to these.

<Duplexer>
<First Embodiment>

Figure 10:
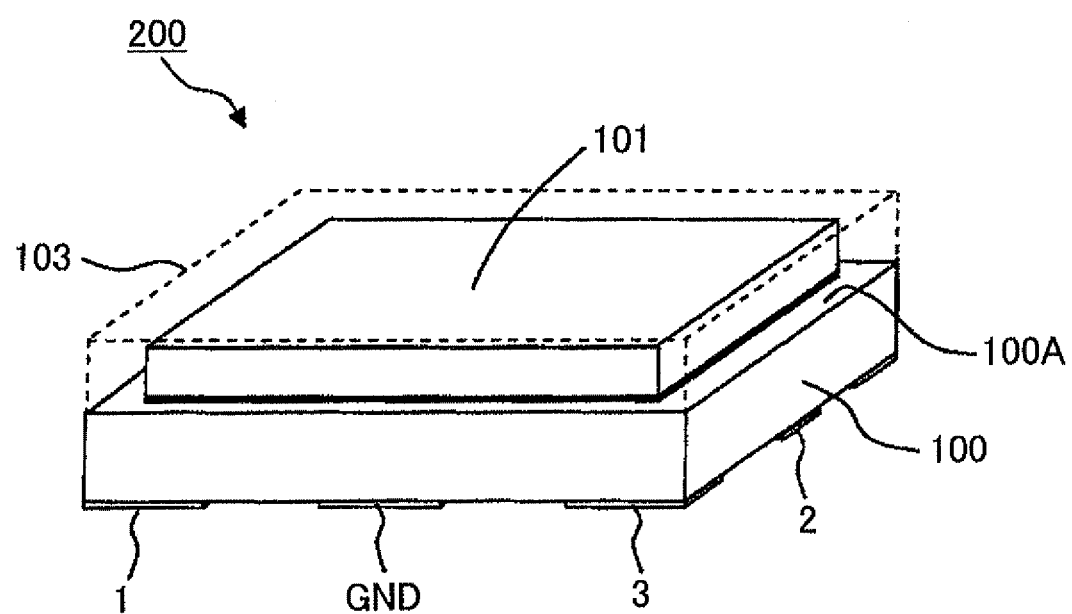
[FIG. 10] A perspective view of the duplexer according to the first embodiment of the present invention.

A perspective view of a duplexer 200 according to a first embodiment of the present invention is shown in FIG. 10. The duplexer 200 shown in FIG. 10 is mainly configured by a circuit board 100 formed by stacking a plurality of dielectric layers and by a piezoelectric substrate 101 having a transmitting filter 5 as the first filter and a receiving filter 6 as the second filter. The transmitting filter 5 and receiving filter 6 are both disposed on the major surface of the piezoelectric substrate 101. The piezoelectric substrate 101 is flip-chip mounted on the circuit board 100 in a state with the surface having the transmitting filter 5 and receiving filter 6 disposed thereon (hereinafter also referred to as a "mounting surface 101A") made to face a top surface 100A (second surface) of the circuit board 100. The piezoelectric substrate 101 is set to be one size smaller than the circuit board 100 and protected by the whole being covered by a sealing resin 103 (indicated by a dotted line in the figure). Note that, the thickness of the circuit board 100 is, for example, 350 μm to 400 μm, and the thickness of the piezoelectric substrate 101 is, for example, 230 μm to 280 μm.

Figure 6:
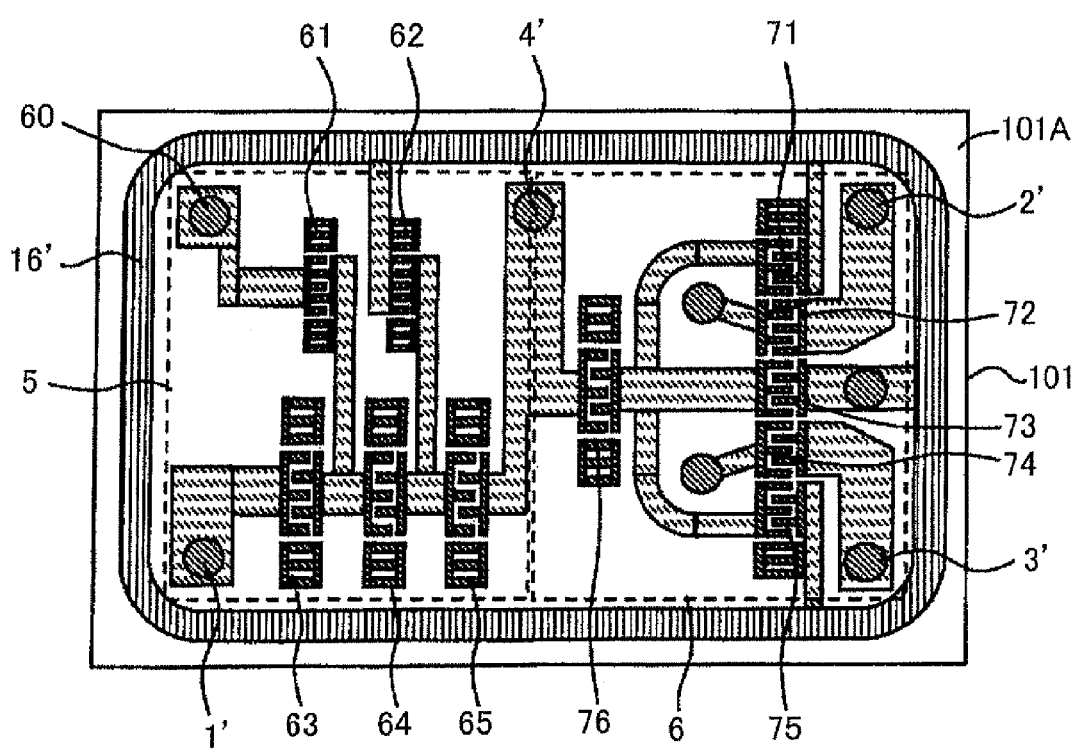
[FIG. 6] A view showing filter patterns formed on a piezoelectric substrate used in the duplexer according to the first embodiment of the present invention.

FIG. 6 is a see-through diagram when viewing the piezoelectric substrate 101 used in the duplexer according to the present embodiment from the top surface side. The transmitting filter 5 in the present embodiment is comprised of a surface acoustic wave filter. Specifically, as shown in FIG. 6, a ladder type filter circuit is configured by serially connecting or parallel connecting a plurality of surface acoustic wave resonators 61, 62, 63, 64, and 65. The surface acoustic wave resonators 61 and 62 are parallel resonators, while the surface acoustic wave resonators 63, 64, and 65 are serial resonators. On the other hand, the receiving filter 6 configures part of a longitudinally coupled multimode type filter circuit and is a surface acoustic wave filter provided with a plurality of surface acoustic wave resonators 71, 72, 73, 74, 75, and 76 as shown in FIG. 6. Note that, in FIG. 6, 1' is a terminal electrically connected to a transmission side signal terminal 1 of the circuit board 100, 2' and 3' are terminals electrically connected to reception side signal terminals 2 and 3 of the circuit board 100, and 4' is a terminal electrically connected to the antenna terminal 4 of the circuit board 100.

The transmitting filter 5 and the receiving filter 6 may be fabricated on the same piezoelectric substrate or fabricated on individual piezoelectric substrates. However, as shown in FIG. 6, these are desirably fabricated on the same piezoelectric substrate. In the production of duplexers, production variations occur in the transmitting filter 5 and in the receiving filter 6. When fabricating filters on individual substrates, transmitting filters and receiving filters having a variety of production variations will be combined, so there is possibility that the optimum inductance value of the line patterns of a matching circuit will end up differing according to the combination. However, when fabricating these on the same piezoelectric substrate, they become filters fabricated at almost the same place of a wafer. Therefore, when viewed by a transmitting filter and a receiving filter on the same substrate, the optimum inductance value becomes almost the same in all of the substrates cut from the wafer, therefore the necessity of concern over variations according to the combination disappears. Further, from the viewpoint of reduction of size as well, it is more advantageous if the transmitting filter and the receiving filter are formed on the same piezoelectric substrate.

Figure 2:
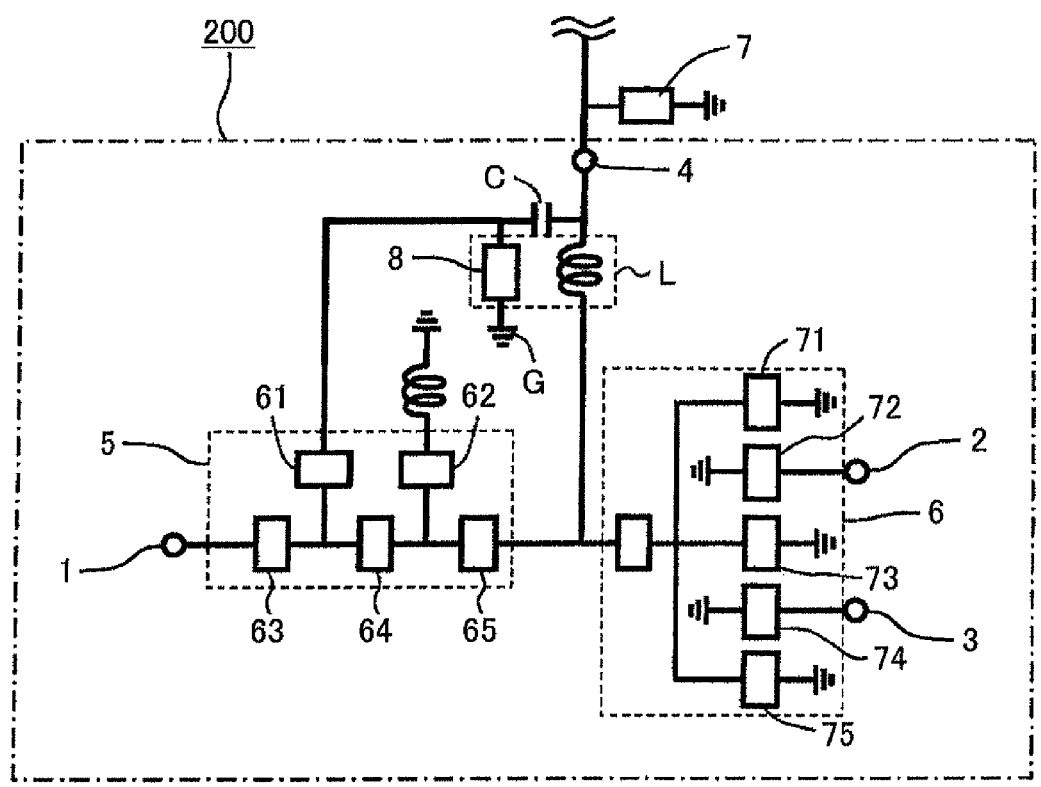
[FIG. 2] An equivalent circuit diagram of the duplexer according to the first embodiment of the present invention.
Figure 4A:
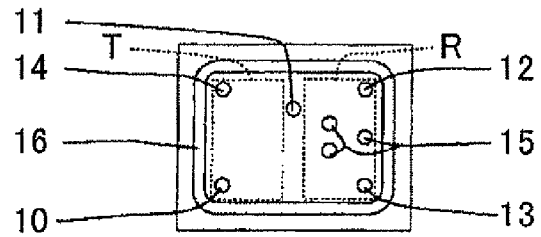
[FIG. 4] Views showing a modification of the circuit board shown in FIG. 1.
Figure 4B:
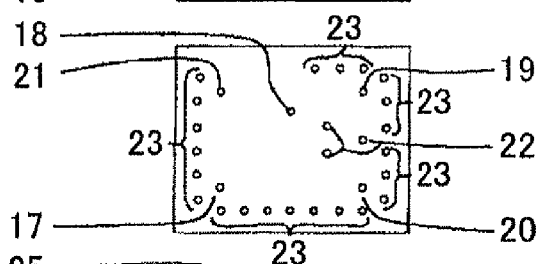
Figure 4D:
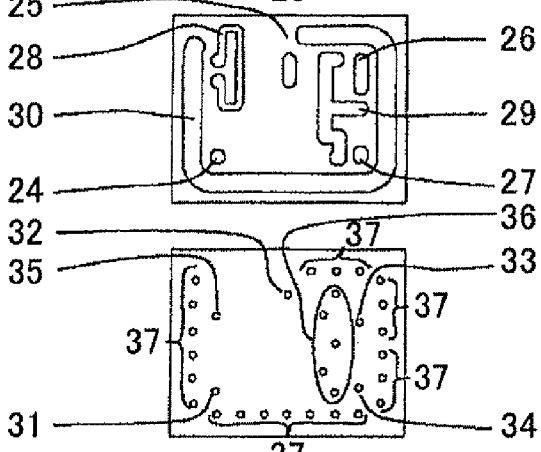
Figure 4E:
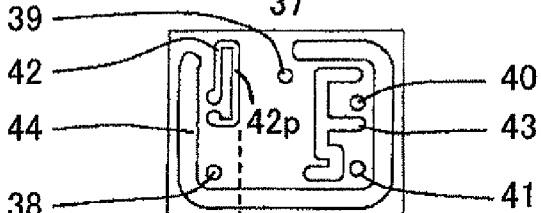
Figure 4F:
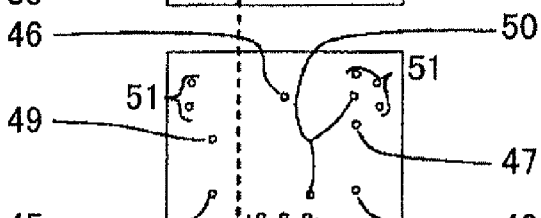
Figure 4G:
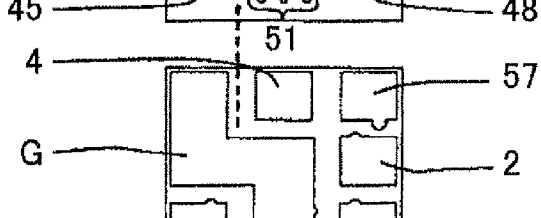

By the configuration as shown in FIG. 6, the transmitting filter 5 and the receiving filter 6 indicated by the broken lines in the equivalent circuit diagram of FIG. 2 are formed. The transmitting filter 5 and the receiving filter 6 are set so that their passband frequencies differ from each other. In the present embodiment, those are set so that the passband of the receiving filter 6 becomes higher than the passband of the transmitting filter 5.

Further, the transmitting filter 5 is a filter in which both of an input signal and an output signal are unbalanced signals, while the receiving filter 6 is a filter in which the input signal is an unbalanced signal, and the output signal is a balanced signal. Namely, in FIG. 2, the transmission signal terminal 1 is an unbalanced signal terminal, and the reception signal terminals 2 and 3 are balanced signal terminals.

As shown in FIG. 2, in the duplexer 200 in the present embodiment, an electromagnetic coupling element 8 is arranged between a surface acoustic wave resonator 61, one of the components of the transmitting filter 5, and a ground part G. This electromagnetic coupling element 8 is a device for making the transmission signal have an attenuation pole in the passband of the receiving filter. By providing this device, the transmission signal is prevented from leaking to the receiving circuit side. In the duplexer in the present embodiment, the electromagnetic coupling element 8 and the antenna terminal are electromagnetically coupled. By employing such a configuration, a route over which the signal passes is formed between the electromagnetic coupling element 8 and the antenna terminal 4, and a signal which has not completely dropped to the ground can be dropped to the antenna terminal 4 side through this route. Accordingly, a duplexer improved in the isolation characteristic and the attenuation characteristic together and excellent in electrical characteristics can be achieved.

Note that, in the present embodiment, the electromagnetic coupling between the electromagnetic coupling element 8 and the antenna terminal 4 is realized by a capacitive coupling C and an inductive coupling L as shown in FIG. 2.

Next, an explanation is given of the circuit board 100. FIG. 1 show dielectric layers configuring the circuit board 100.

The circuit board 100 used in the duplexer 200 according to the present embodiment is formed by stacking three dielectric layers. In FIG. 1, FIG. 1A shows patterns formed on the surface 100A on which the piezoelectric substrate 101 is mounted, FIG. 1G shows patterns formed on a back surface (first surface) of the circuit board 100, FIG. 1C and FIG. 1E show patterns formed at inner layers of the circuit board 100, FIG. 1B shows vias for connection between the patterns shown in FIG. 1A and the patterns shown in FIG. 1C, FIG. 1D shows vias for connection between the patterns shown in FIG. 1C and the patterns shown in FIG. 1E, and FIG. 1F shows vias for connection between the patterns shown in FIG. 1E and the patterns shown in FIG. 1G. In this example, the piezoelectric substrate 101 having the transmitting filter 5 and receiving filter 6 formed thereon is flip-chip mounted on the circuit board 100 in a state with the first major surface 101A and the second major surface 100A facing each other.

In FIG. 1A, a ring electrode 16 is a pattern for securing a vibration space of the surface acoustic wave resonators and air-tightly sealing these surface acoustic wave resonators and is joined with a ring electrode 16' disposed on the first major surface 101A of the piezoelectric substrate 101 by joining material such as solder or the like.

In the present embodiment, the case where the piezoelectric substrate 101 is flip-chip mounted on the circuit board 100 is shown. However, it is not necessarily flip-chip mounted. Connection terminals of the filter and connection terminals of the circuit board may be connected by wire bonding or another method after face-up mounting as well. Further, the present embodiment shows a case where the transmitting filter 5 and receiving filter 6 are fabricated on the same piezoelectric substrate and are provided with terminal electrodes and ring electrodes capable of connection with the patterns shown in FIG. 1A. In this example, the transmitting filter 5 is arranged in a region T on the left side including the patterns 10 and 14, and the receiving filter 6 is arranged in a region R on the right side including the patterns 12, 13, and 15.

As shown in FIG. 1, a transmission signal input from the transmission side signal terminal 1 (first terminal) is input through a via 45, pattern 38, via 31, pattern 24, via 17, and pattern 10 to the transmitting filter 5. The transmission signal output from the transmitting filter 5 is output to an antenna (not shown) connected through a pattern 11, via 18, pattern 25, via 32, pattern 39, via 46, and antenna terminal 4. Further, a reception signal input from the antenna is input through the antenna terminal 4, via 46, pattern 39, via 32, pattern 25, via 18, and pattern 11 to the receiving filter 6 and is output from the reception side signal terminals 2 and 3 (second terminals) through patterns 12 and 13, vias 19 and 20, patterns 26 and 27, vias 33 and 34, patterns 40 and 41, and vias 47 and 48.

Note that, in the present embodiment, a matching inductance 7 connected to the antenna terminal 4 is arranged at the outside of the duplexer 200 as shown in FIG. 2 and matches the transmitting filter 5 and the receiving filter 6.

The electromagnetic coupling element 8 is comprised of a first wiring pattern. The first wiring pattern is comprised of a pattern 14, via 21, pattern 28, via 35, pattern 42, and via 49 and is connected to the ground part G. By connection of the pattern 14 with a ground pad 60 on the piezoelectric substrate 101 side, the first wiring pattern comprising the electromagnetic coupling element 8 will be connected to the parallel resonator of the transmitting filter, that is, the surface acoustic wave resonator 61.

In the present embodiment, in order to electromagnetically couple the electromagnetic coupling element 8 and the antenna terminal 4, no other wiring conductor is interposed between a portion of the first wiring pattern and the antenna terminal 4. Specifically, a portion 42p of the pattern 42 and the antenna terminal 4 are arranged so that no other conductor is interposed between the two. By arranging the parts in this way, capacitive coupling and inductive coupling occur between the portion 42p of the pattern 42 and the antenna terminal 4. Accordingly, a route is formed for a signal to pass through the parallel resonator of the transmitting filter 5, that is, the surface acoustic wave resonator 61, and the electromagnetic coupling element 8 and flow to the antenna terminal 4, and the level of the signal passing through the transmitting filter 5 becomes low. On the other hand, the attenuation level of the transmitting filter 5 in the reception band becomes high, but the magnitude of the capacitive coupling between the electromagnetic coupling element 8 and the antenna terminal 4 can be adjusted by changing the arrangement of the pattern 42 forming the principal portion of the first wiring pattern with respect to the antenna terminal 4, so it becomes possible to adjust the attenuation level of the transmitting filter in the reception band and isolation level.

In FIG. 1, a dotted line is drawn down from a portion 42p of the pattern 42 toward the dielectric layer shown in FIG. 1G in which the antenna terminal 4 is arranged in order to show the positional relationship between the portion 42p of the pattern 42 and the antenna terminal 4. As seen from this, in the present embodiment, the portion 42p of the pattern 42 and the antenna terminal 4 are in a positional relationship slightly offset from a superimposed position when viewed on a plane. In other words, the portion 42p of the pattern 42 and the antenna terminal 4 are in a positional relationship facing each other in a slanted direction, but even in such case can be electromagnetically coupled by not providing another wiring line between the two. Namely, if another wiring line is not interposed on the straight line connecting the portion 42p of the pattern 42 and the antenna terminal 4 with the shortest distance, the two can be electromagnetically coupled. Conversely speaking, the portion 42p of the pattern 42 means a portion in the pattern 42 which can be connected with the antenna terminal 4 by the straight line without obstruction by another wiring line between the two.

As the material of the dielectric configuring the circuit board 100, use is made of for example a ceramic containing alumina as a principal ingredient, a glass ceramic which can be sintered at a low temperature, a glass epoxy resin containing an organic material as a principal ingredient, or the like. When using a ceramic or glass ceramic, the board is formed by homogeneously kneading a metal oxide such as a ceramic or the like and an organic binder by an organic solvent or the like to form a slurry, forming this into sheets to prepare green sheets, forming the desired conductor patterns and vias, then stacking and press bonding these green sheets to thereby form an integral assembly and then firing it.

First wiring patterns are fabricated on the surfaces of the dielectric layers by a conductor, then are connected between the dielectric layers by vias filled with a conductor. Here, as the conductor, use can be made of silver, an alloy obtained by adding palladium to silver, tungsten, copper, gold, etc. These patterns are prepared by forming metal conductors by screen printing or a combination of film formation process such as vapor deposition, sputtering, or the like with etching. The patterns to be directly connected with the filter and the terminals connected when mounting the duplexer in an external circuit such as a PCB or the like may be plated at the surface with Ni or Au etc. if necessary for good bonding with the connection terminals of the filter.

FIG. 3 are views showing a modification of the patterns of the circuit board 100 shown in FIG. 1. The example shown in FIG. 3 has almost the same configuration as that of FIG. 1, but the distance between the portion 42p of the pattern 42 forming the first wiring pattern and the antenna terminal 4 is made smaller. Namely, the portion 42p of the pattern 42 and the antenna terminal 4 are in a positional relationship where they are superimposed on each other in an up/down direction. When arranged in this way, the capacitive coupling can be made larger.

FIG. 4 are views showing another modification of the patterns of the circuit board 100 shown in FIG. 1. The example shown in FIG. 4 has almost the same configuration as that of FIG. 1, but the distance between the portion 42p of the pattern 42 forming the first wiring pattern and the antenna terminal 4 is made larger. Namely, the portion 42p of the pattern 42 and the antenna terminal 4 are arranged so that the distance between the two becomes larger than that shown in FIG. 1 when viewed on a plane. When arranged in this way, the capacitive coupling of the two can be made smaller.

According to the duplexer 200 of the present embodiment explained above, the electromagnetic coupling element is electromagnetically coupled with the antenna terminal, therefore a route is formed over which the signal passes between the electromagnetic coupling element 8 and the antenna terminal 4, and a signal which has not completely dropped the ground can be dropped to the antenna terminal through this route. Accordingly, a duplexer having both an isolation characteristic and attenuation characteristic which are improved and excellent in electrical characteristics can be achieved.

<Second Embodiment>

Next, an explanation is given of a duplexer 300 according to a second embodiment of the present invention. Note that, the same notations are attached to the same components as those of the duplexer 200 according to the first embodiment explained above, and an explanation thereof will be sometimes omitted.

Figure 14:
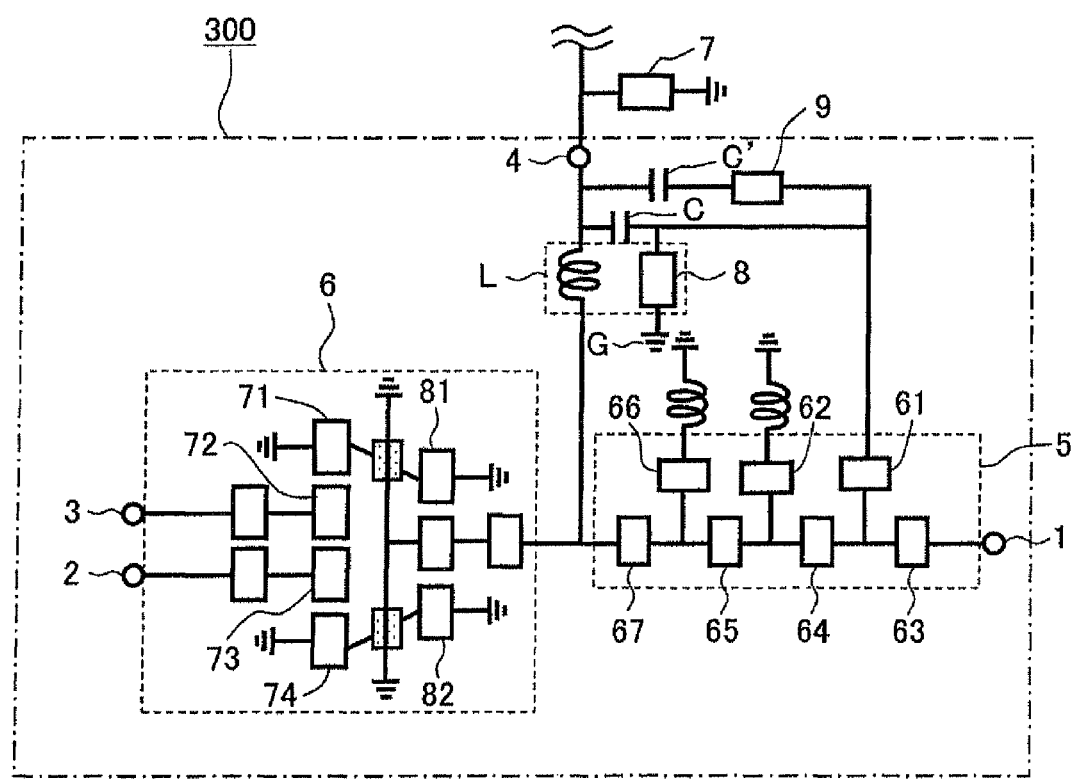
[FIG. 14] An equivalent circuit diagram of a duplexer according to a second embodiment of the present invention.

FIG. 14 is an equivalent circuit diagram of a duplexer 300. As shown in the figure, the duplexer 300 is provided with a second electromagnetic coupling element 9 electrically connected to the surface acoustic wave resonator 61. This second electromagnetic coupling element 9 is electromagnetically coupled with the antenna terminal 4 (a capacitive coupling C' in this embodiment). By providing such a second electromagnetic coupling element 9, the function of the electromagnetic coupling element 8 can be raised more. Namely, by providing the second electromagnetic coupling element 9, in addition to the signal passage route between the electromagnetic coupling element 8 and the antenna terminal 4, a signal passage route between the second electromagnetic coupling element 9 and the antenna terminal 4 is formed, therefore a signal which has not completely dropped to the ground can be more reliably run to the antenna terminal side. Accordingly, a greater improvement of the isolation characteristic can be achieved.

Figure 15:
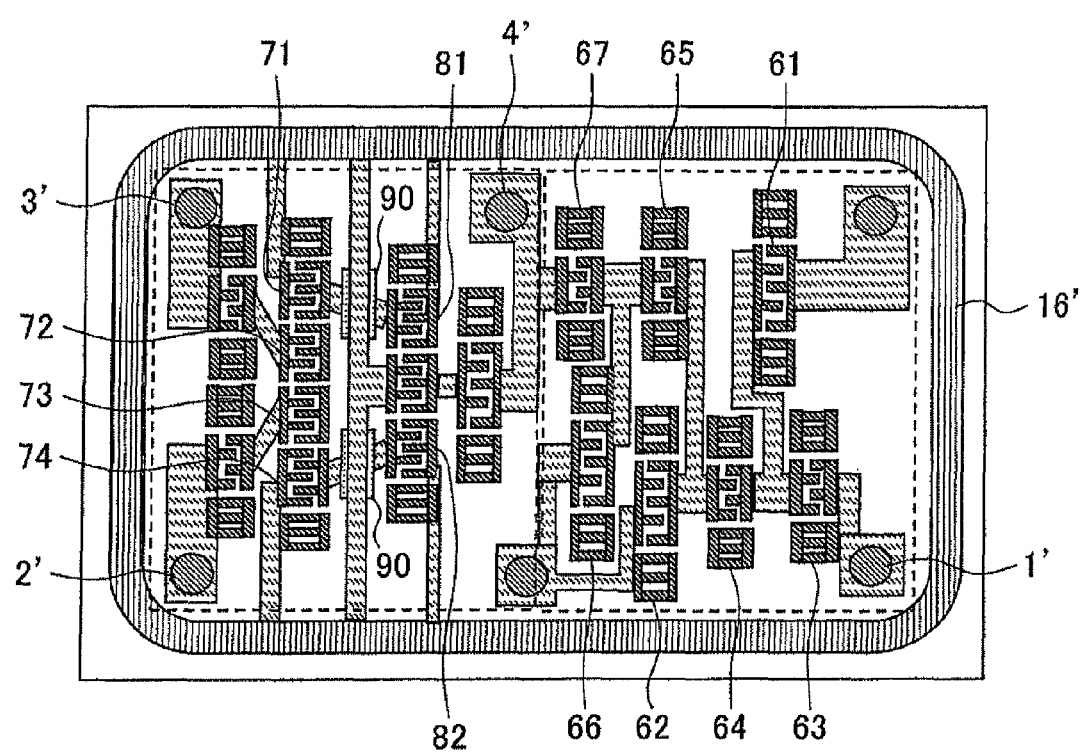
[FIG. 15] A view showing filter patterns formed on a piezoelectric substrate used in the duplexer according to the second embodiment of the present invention.

FIG. 15 is a see-through view of the piezoelectric substrate 101 used in the duplexer 300 when seen from the top surface side. The transmitting filter 5 of the duplexer 300 is comprised of a surface acoustic wave filter in the same way as the duplexer 200. Specifically, by connecting a plurality of surface acoustic wave resonators 61 to 67 in series or parallel as shown in FIG. 15, a ladder type filter circuit is configured. On the other hand, the receiving filter 6 configures a longitudinally coupled multimode type filter circuit and is comprised of a plurality of surface acoustic wave resonators 71 to 74. In the front and back of these resonators, other resonators are arranged, and adjustment of the attenuation pole and so on are carried out. Further, a wiring line connecting the surface acoustic wave resonator 71 and a resonator 81 arranged in front and a wiring line for the ground intersect while an insulation layer 90 is between them. By employing a 3D wiring structure by using the insulation layer 90 in this way, the piezoelectric substrate 101 can be reduced in size and accordingly the duplexer 300 can be reduced in size. In the same way, a wiring line connecting the surface acoustic wave resonator 74 and a resonator 82 arranged in the front and the wiring line for the ground intersect in a 3D manner while the insulation layer 90 is between them.

Figure 16:
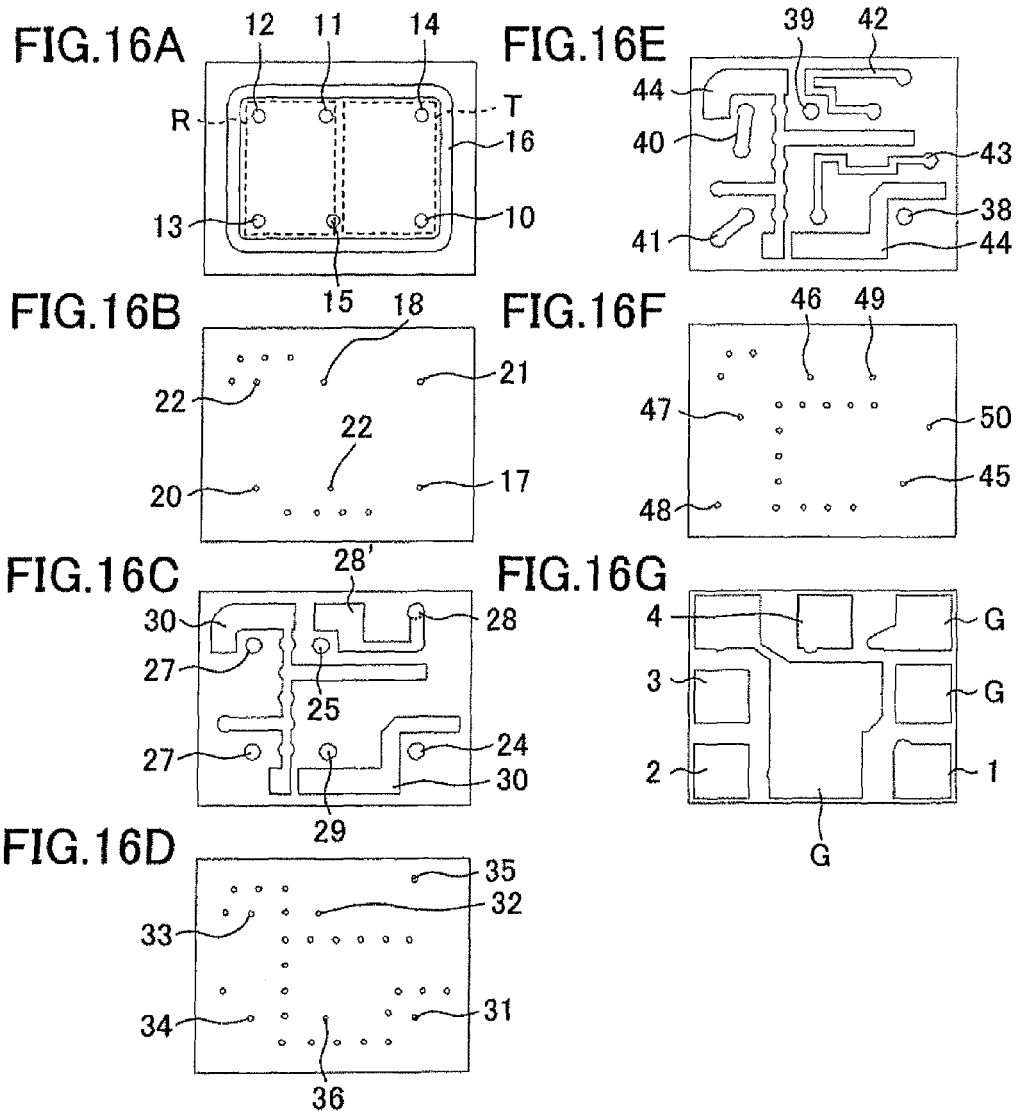
[FIG. 16] Views showing pattern layouts and via layouts of layers of the circuit board used in the duplexer according to the second embodiment of the present invention.

FIG. 16 show dielectric layers configuring the circuit board 100 used in the duplexer 300. The circuit board 100 shown in the figure is formed by stacking three dielectric layers. In the dielectric layer positioned at the uppermost layer of the circuit board 100 (FIG. 16A), patterns are provided to be connected with various types of terminals provided on the major surface of the piezoelectric substrate 101. Note that, in this example, the piezoelectric substrate 101 is flip-chip mounted so that the transmitting filter 5 faces a region T on the right side surrounded by a broken line, and the receiving filter 6 faces a region R on the left side surrounded by a broken line.

The first wiring patterns forming the electromagnetic coupling element 8 are comprised of a pattern 14, via 21, pattern 28, via 35, pattern 42, and via 49 and are finally connected to the ground part G. The pattern 42 forming a portion of the first wiring patterns is arranged so that no other wiring line is interposed between it and the antenna terminal 4. Accordingly, the pattern 42 and the antenna terminal 4 perform capacitive coupling C and inductive coupling L.

Figure 17:
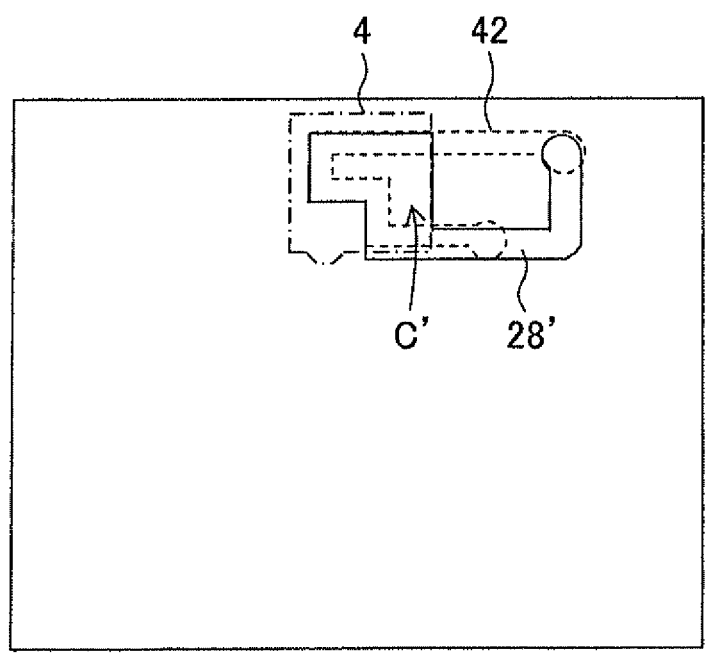
[FIG. 17] A diagram for explaining position relationships between patterns formed on the circuit board used in the duplexer according to the second embodiment of the present invention.

The duplexer 300 has the second electromagnetic coupling element 9 in addition to the electromagnetic coupling element 8 as previously explained using FIG. 14. This second electromagnetic coupling element 9 is comprised of a second wiring pattern 28' formed on the major surface of the dielectric layer at the second layer (FIG. 16C). Note that, in the figure, a boundary between the second wiring pattern 28' and the pattern 28 is indicated by a broken line. The second wiring pattern 28' are is connected at one end to the pattern 28 forming a portion of the first wiring patterns and is not connected at the other end to another wiring line. Further, a portion of the second wiring pattern 28' is arranged so that no other wiring line is interposed between this and the antenna terminal 4. FIG. 17 is a diagram showing the positional relationships of the second wiring pattern 28', antenna terminal 4, and pattern 42 when viewed through the circuit board 100 on a plane, in which the second wiring pattern 28' is indicated by a bold line, the antenna terminal 4 is indicated by a one-dot chain line, and the pattern 42 is indicated by a broken line. In the figure, the portion indicated by an arrow becomes the region in which no other wiring line is interposed between the second wiring pattern 28' and the antenna terminal 4. The second wiring pattern 28' and the antenna terminal 4 engage in capacitive coupling C' in this region. By changing the area of this facing region, the magnitude of the capacitive coupling C' can be adjusted. Accordingly, the isolation level of the filter can be adjusted with a better precision.

Note that, the present invention is not limited to the embodiments explained above. Various alterations and improvements are possible within a range not out of the gist of the present invention.

Figure 11:
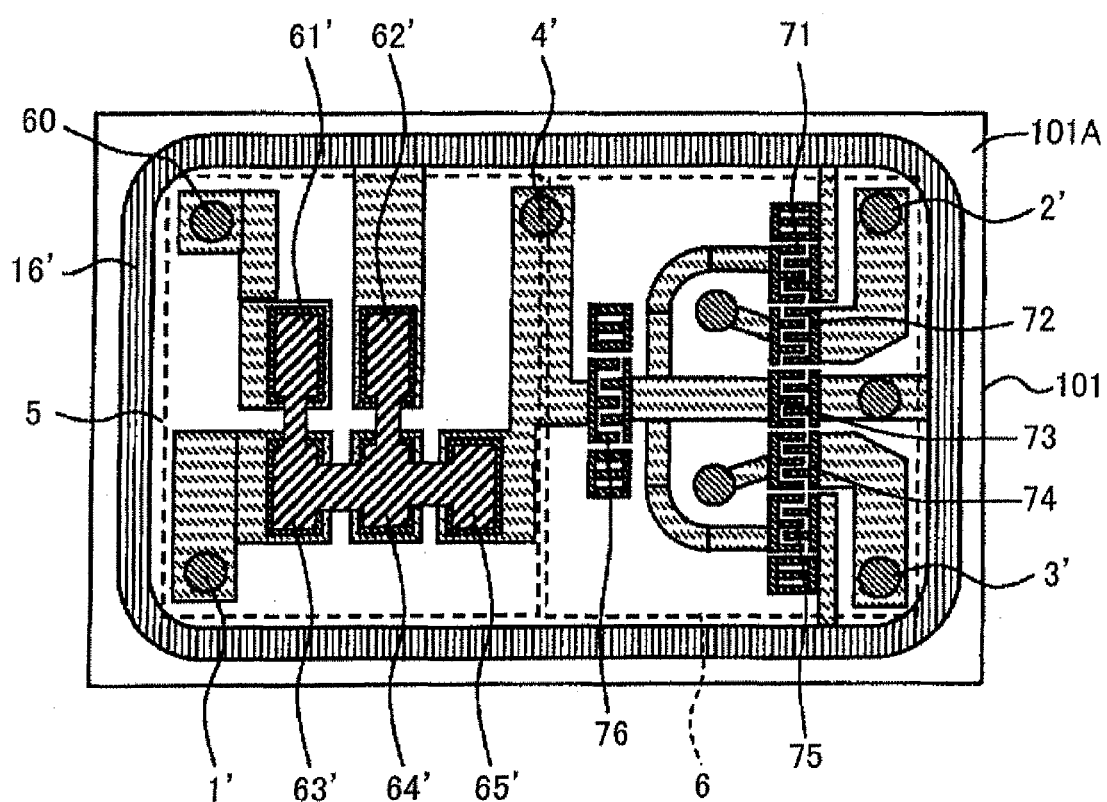
[FIG. 11] A view showing another example of filter patterns formed on the piezoelectric substrate used in the duplexer according to the first embodiment of the present invention.

In the embodiments explained above, the case where the transmitting filter 5 and receiving filter 6 were comprised of surface acoustic wave filters was shown, but the filters are not limited to this configuration. These may be configured by thin film bulk acoustic resonators as well. FIG. 11 is a plan view of the circuit board 100 showing an example where the transmitting filter 5 is configured by a thin film bulk acoustic resonator. Specifically, as shown in FIG. 11, a ladder type filter circuit is configured by connecting a plurality of thin film acoustic wave resonators 61', 62', 63', 64', and 65' in series or parallel. Each thin film acoustic wave resonator includes a lower electrode, a piezoelectric film arranged on the lower electrode, and an upper electrode arranged on the piezoelectric film. A vibration space is formed under the lower electrode.

Figure 13:
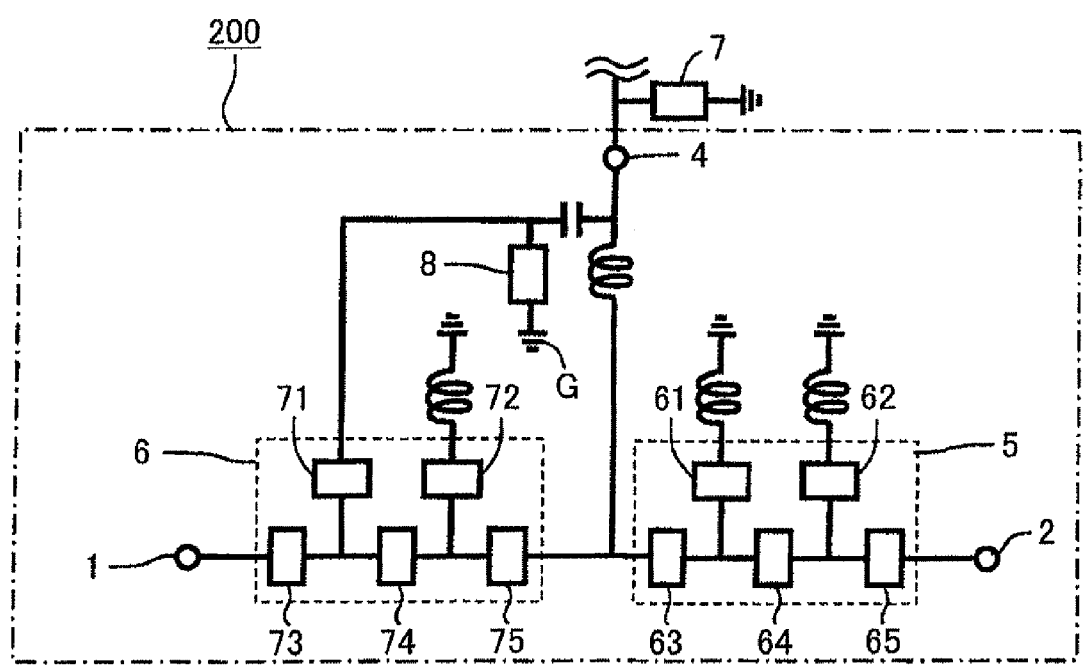
[FIG. 13] An equivalent circuit diagram showing another example of the duplexer according to the first embodiment of the present invention.

Further, in the embodiment explained above, the electromagnetic coupling element 8 was arranged between the parallel resonator of the transmitting filter 5, that is, the surface acoustic wave resonator 71, and the ground part G. However, as shown in FIG. 13, the electromagnetic coupling element 8 may be arranged between the parallel resonator of the receiving filter 6, that is, the surface acoustic wave resonator 61, and the ground part G as well. In this case, the receiving filter 6 corresponds to the first filter, and the transmitting filter 5 corresponds to the second filter. Accordingly, the transmitting filter 5 has a passband higher than the passband of the receiving filter 6.

<Communication Module Component>

Figure 12A:
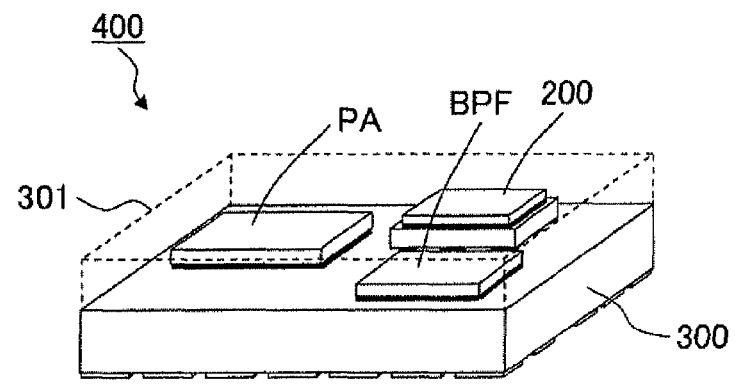
FIG. 12A is a perspective view of the communication module component.
Figure 12B:
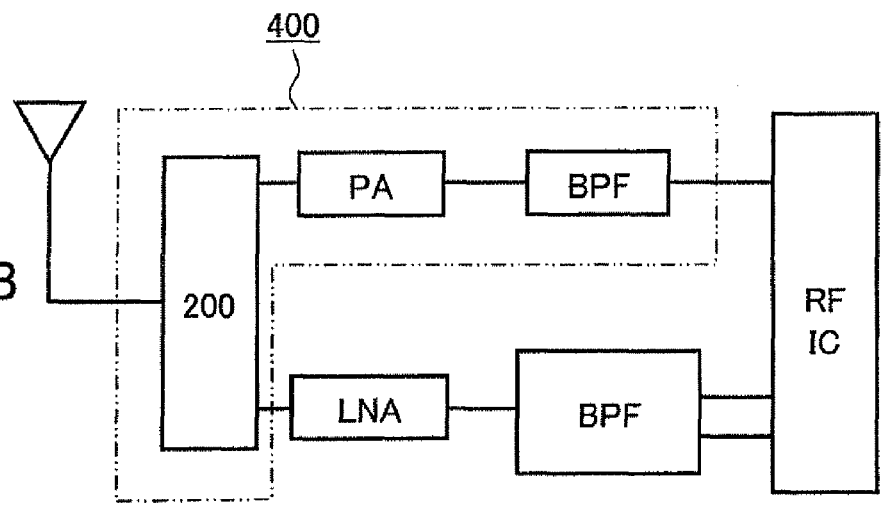
FIG. 12B is a block circuit diagram of the communication module component.

Next, an explanation will be given of an embodiment of the communication module component of the present invention. FIG. 12 is a perspective view of a communication module component 400 according to the present embodiment. The communication module component 400 includes, other than the duplexer 200, a power amplifier PA, a band pass filter BPF. etc. and is used as, for example, a transmission module of a mobile phone etc.

The communication module component 400 is obtained by mounting the duplexer 200, power amplifier PA, and band pass filter BPF on the top surface of a module board 300 and then covering these members by a resin 301. The communication module of the present embodiment is excellent in electrical characteristics since the duplexer 200 explained above is mounted. Note that, it is also possible to form internal patterns of the circuit board 100 of the duplexer 200 inside the module board 300 and directly mount the piezoelectric substrate 101 on the module board 300. Further, the duplexer 300 according to the second embodiment may be used in place of the duplexer 200.

<Communication Device>

Figure 5:
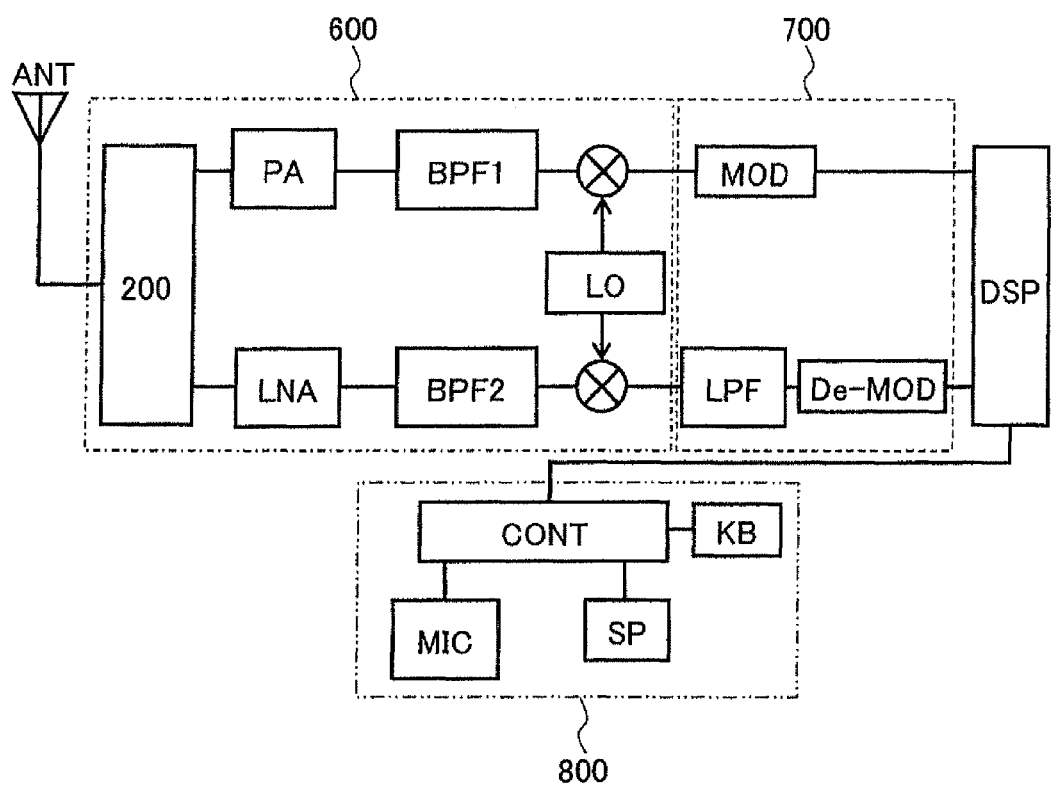
[FIG. 5] A block diagram of a communication device according to the first embodiment of the present invention.

Next, an explanation will be given of an embodiment of a communication device of the present invention. FIG. 5 is a block diagram of a communication device according to the present embodiment. The communication device shown in FIG. 5 is provided with an antenna ANT, an RF circuit 600 connected to the antenna ANT, an IF circuit 700 connected to the RF circuit 600, a signal processing circuit DSP connected to the IF circuit, and an interface part 800 connected to the signal processing circuit DSP.

The RF circuit 600 is provided with a duplexer 200, power amplifier PA, transmitting band pass filter BPF1, low noise amplifier LNA, receiving band pass filter BPF2, and local oscillator LO. The IF circuit 700 is provided with a modulator MOD, low pass filter LPS, and demodulator De-MOD. The user interface part 800 is provided with a control part CONT, operation part KB, microphone MIC, and speaker SP.

As shown in the figure, an audio signal input from the microphone MIC is A/D converted at the DSP (digital signal processor), then modulated at the modulator MOD, and further frequency-converted by a mixer by using an oscillation signal of the local oscillator LO. The output of the mixer passes through the transmitting band pass filter BPF1 and the power amplifier PA, passes through the duplexer 200, and is output to the antenna ANT. The reception signal from the antenna ANT passes through the duplexer 200 and is input to the mixer after passing through a low noise amplifier LNA and the receiving band pass filter BPF2. The mixer converts the frequency of the reception signal by using the oscillation signal of the local oscillator LO, then the converted signal passes through the low pass filter LPF, is demodulated at the demodulator De-MOD, and further D/A converted at the DSP, whereby an audio signal is output from the speaker. The communication device shown in FIG. 5 is provided with the duplexer 200, therefore speech with little noise is possible. Note that, the duplexer 300 according to the second embodiment may be used in place of the duplexer 200 as well.

EXAMPLES

An explanation is given of examples of fabrication of duplexers by using circuit boards 100 shown in FIGS. 1, 3, and 4. Note that, the examples shown below are only examples of the embodiments of the present invention. The present invention is not limited to these.

First, lithium tantalate ($LiTaO_3$) was used as the piezoelectric substrate 101, a thin Ti film having a thickness of 6 nm was formed on the major surface thereof, and a thin. Al—Cu film having a thickness of 157 μm was formed on that.

Next, a photoresist was coated to a thickness of about 0.5 μm by a resist coating system. Then, by a reduced projection exposure apparatus (stepper), photoresist patterns corresponding to resonators and signal lines, pad electrodes etc., and a ring electrode 16' surrounding the resonators and signal lines, pad electrodes, etc. were formed. The ring electrode 16' is soldered with the ring electrode 16 formed on the circuit board, has a function as a ground pattern, and has a function of air-tightly sealing the surface acoustic wave element 22. Further, unnecessary portions of the photoresist were dissolved by an alkali developer in developing apparatus.

Next, an electrode patterns shown in FIG. 6 were formed by an RIE (reactive ion etching) system. Then, a protective film was formed on the predetermined region of the electrode patterns. Namely, a CVD (chemical vapor deposition) system was used to form an $SiO_2$ film on the electrode patterns and the major surface of the piezoelectric substrate to a thickness of about 15 nm. Then, the photoresist was patterned by photolithography, and the $SiO_2$ film is etched at the flip-chip electrode sections (input/output electrodes, ground electrodes, and pad electrodes) by the RIE system or the like. Next, by using a sputtering system, multilayer electrodes comprised of Cr, Ni, and Au were formed in portions from which the $SiO_2$ film was removed. The electrode film thicknesses at this time were set to 0.01 μm, 1 μm, and 0.2 μm respectively. Further, the photoresist and the unnecessary portions of the multilayer electrodes were simultaneously removed by a lift-off method, then the portions at which the multilayer electrodes were formed was used as the flip-chip electrode sections for connection with the flip-chip bumps.

Next, the piezoelectric substrate was diced along the dicing lines to divide it into chips of the filter elements.

Next, at the top surface of the multilayer structure circuit board 100 made of ceramic, a conductive material was printed over pattern electrodes, input/output conductors, and ground conductors made of silver. Solder was used as the conductive material. Then, each chip was temporarily bonded to the circuit board by a flip-chip mounting system so that the electrode formation surface became the bottom surface. The temporary bonding was carried out in an $N_2$ atmosphere. Further, the assembly was baked in an $N_2$ atmosphere to melt the solder and thereby bond the chip and the circuit board. Note that the present circuit board is a composite board and has a plurality of chips mounted on it.

Next, a resin was coated on the circuit board having the chips mounted thereon, the board was baked in the $N_2$ atmosphere, and the chips were sealed by resin.

Next, the large-sized board including the many circuit boards was diced along the dicing lines to divide it into individual pieces and thereby obtain the duplexers of the present invention. Note that, each individual piece of the ceramic circuit board had a mounting area of 2.5×2.0 mm and a height of 0.9 mm. Duplexers of the present embodiment were fabricated as described above.

Figure 7:
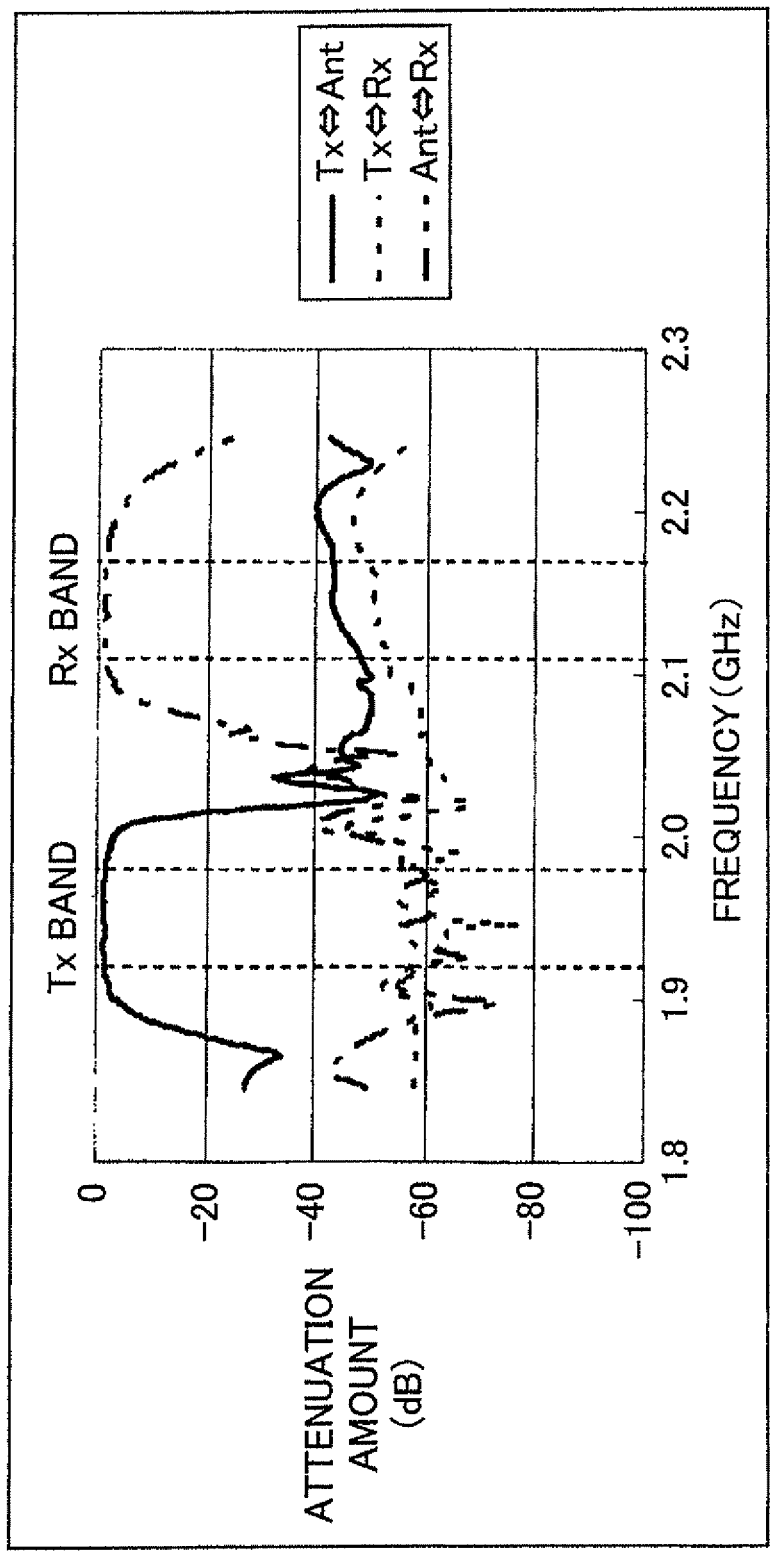
[FIG. 7] A diagram showing electrical characteristics when using a circuit board shown in FIG. 1 and a piezoelectric substrate shown in FIG. 6 to fabricate a duplexer.
Figure 8:
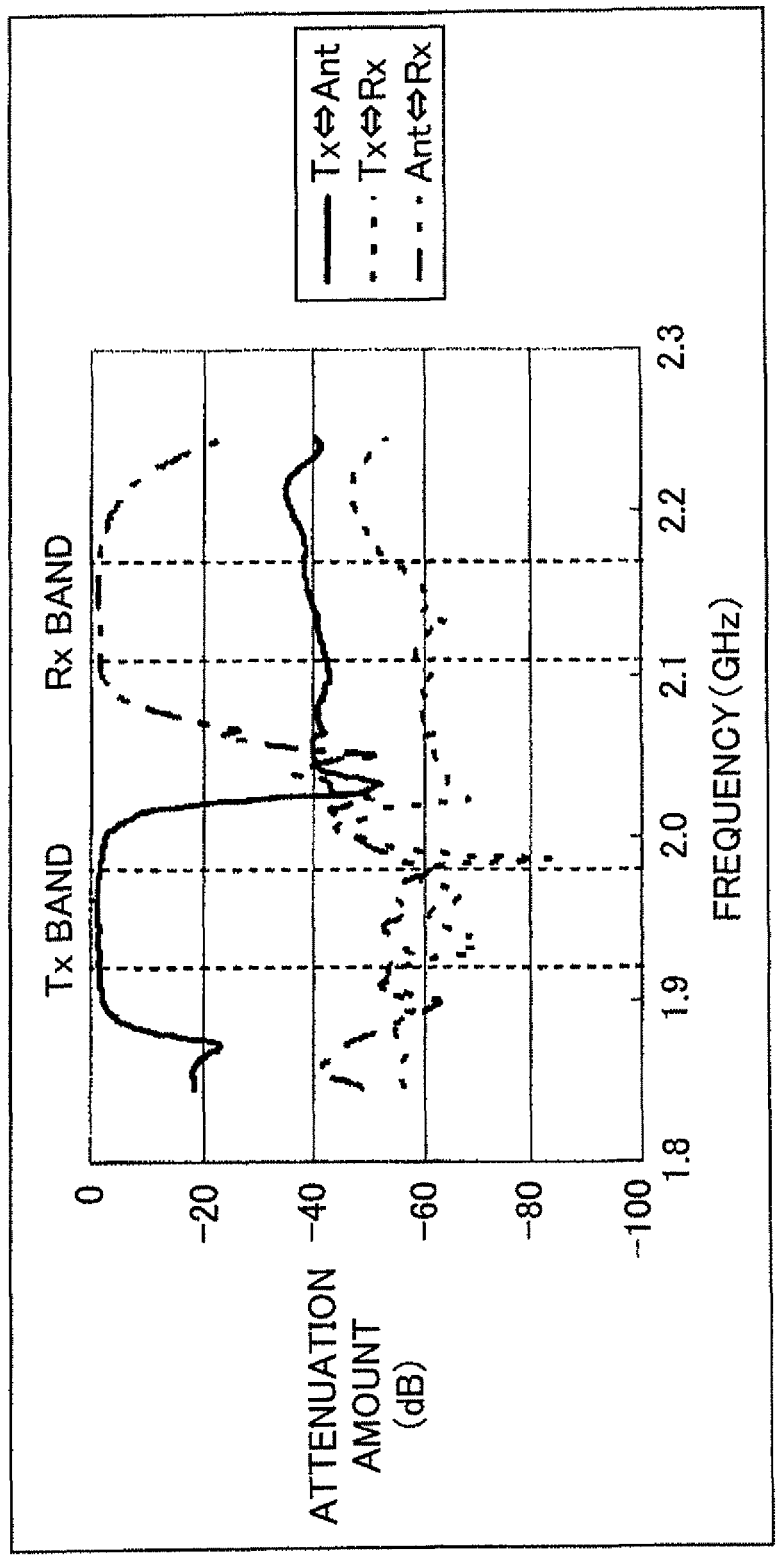
[FIG. 8] A diagram showing electrical characteristics when using a circuit board shown in FIG. 3 and a piezoelectric substrate shown in FIG. 6 to fabricate a duplexer.
Figure 9:
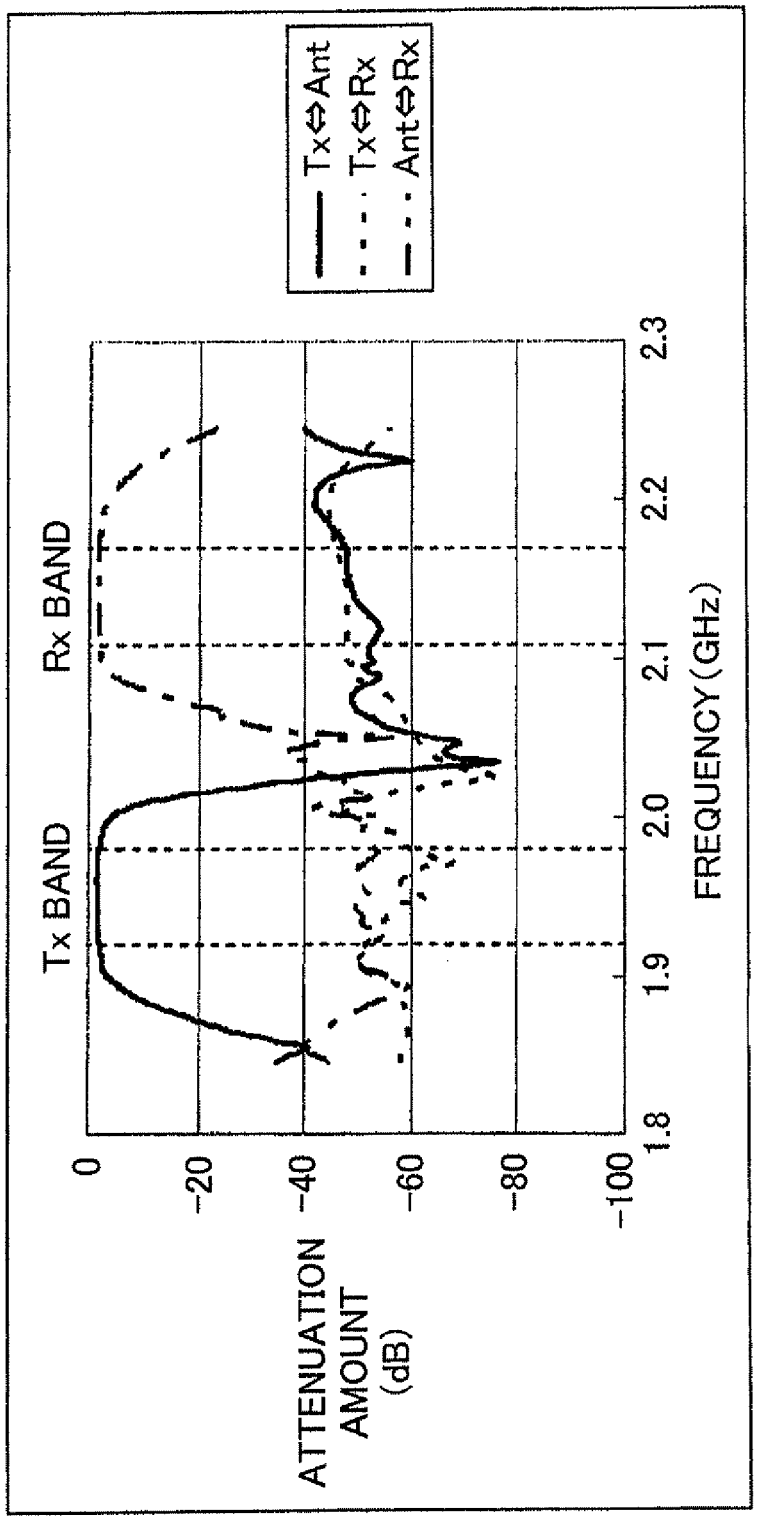
[FIG. 9] A diagram showing electrical characteristics when using a circuit board shown in FIG. 4 and a piezoelectric substrate shown in FIG. 6 to fabricate a duplexer.

Further, the duplexer was mounted on a printed circuit board, then the S parameters between ports were measured by using a network analyzer through an SMA connector and a coaxial cable. Data of the transmission coefficients between the transmitting terminals and the receiving terminals, out-of-band attenuation, and isolation in the 2.1 GHz band are shown in Table 1 and FIGS. 7, 8, and 9. Note that, Example 1 is a duplexer fabricated by using the circuit board 100 shown in FIG. 1, Example 2 is a duplexer fabricated by using the circuit board 100 shown in FIG. 3, and Example 3 is a duplexer fabricated by using the circuit board 100 shown in FIG. 4. In Table 1 and FIGS. 7 to 9, the Tx band is a band of 1.92 to 1.98 GHz, and the Rx band is a band of 2.11 to 2.17 GHz.

TABLE 1

| | Transmitting filter | | Receiving filter | | Isolation | |
|---|---|---|---|---|---|---|
| | Insertion loss (dB) | Attenuation Rx band (dB) | Insertion loss (dB) | Attenuation Tx band (dB) | Tx band (dB) | Rx Band (dB) |
| Example 1 | −1.8 | −42.9 | −1.5 | −54.8 | −57.2 | −49.4 |
| Example 2 | −1.7 | −38.2 | −1.6 | −52.4 | −56.1 | −53.8 |
| Example 3 | −1.9 | −47.6 | −1.8 | −49.7 | −52.5 | −45.9 |

Further, the filter characteristic values of the Tx band and Rx band corresponding to FIGS. 1, 3, and 4 are shown in Table 1. It is seen from these results that the attenuation level of the transmitting filter in the reception band becomes higher as the portion 42p of the pattern 42 approaches the antenna terminal 4 more. Further, it is seen that adjustment of the attenuation level of the transmitting filter in the reception band and isolation level is possible by the positional relationship between the first wiring patterns forming the electromagnetic coupling element 8 and the antenna terminal.

Next, an explanation is given of the duplexer of Example 4.

The duplexer of Example 4 is fabricated by using a piezoelectric substrate 101 shown in FIG. 15 and a circuit board 100 shown in FIG. 16. The fabrication method and materials used of the duplexer of Example 4 are the same as those of Examples 1 to 3 explained before, therefore an explanation is omitted. Note, the thickness of the electrodes formed on the major surface of the circuit board 100 is different from those of the duplexers of Examples 1 to 3. In the duplexer of Example 4, the thin Ti film is 6 nm, and the thin Al—Cu film formed on that is 391 nm.

Figure 18:
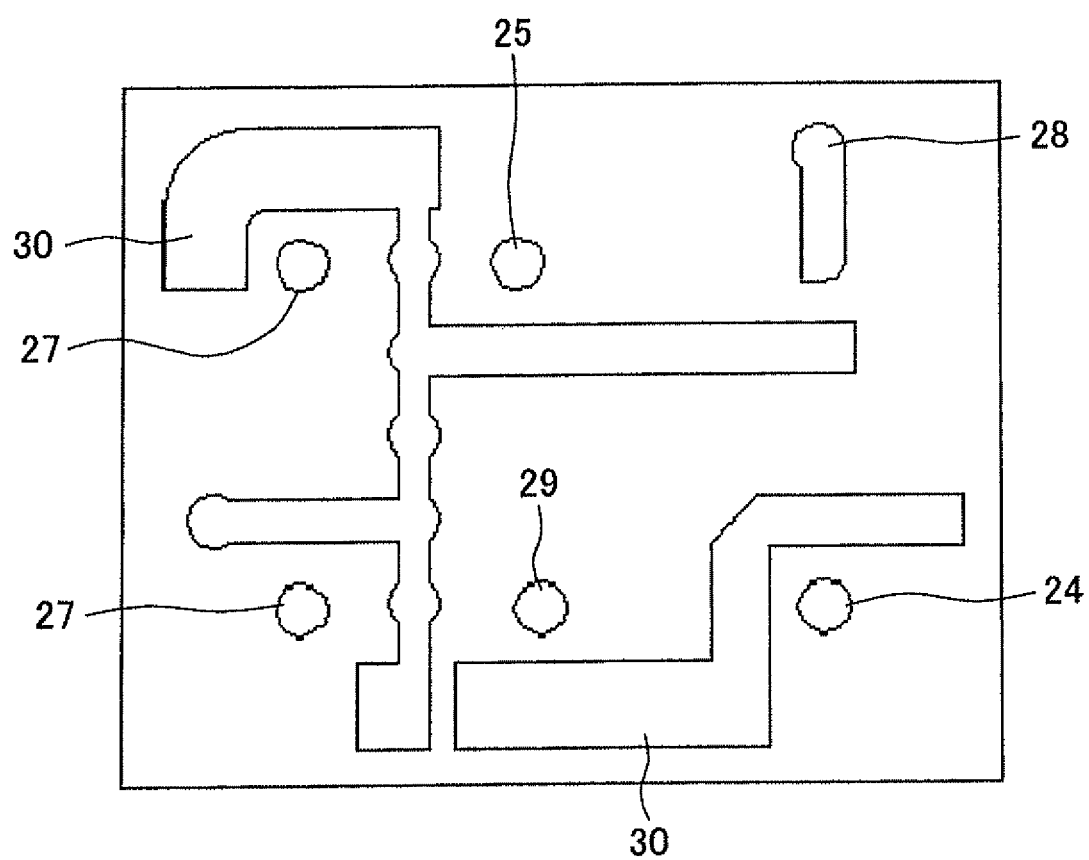
[FIG. 18] A diagram showing a pattern formed on a circuit board used in a duplexer of comparative example.

On the other hand, a duplexer of a comparative example was fabricated by using the same materials and by the same method as those of the duplexer of Example 4. The duplexer of the comparative example differs from the duplexer of Example 4 in the patterns in the dielectric layer shown in FIG. 16C. FIG. 18 is a plan view showing the patterns of the dielectric layer corresponding to FIG. 16C for the duplexer of the comparative example. As shown in the figure, the duplexer of the comparative example does not have the second wiring pattern 28', but components other than that are exactly the same as those of the duplexer of Example 4.

Using such a duplexer of Example 4 and the duplexer of the comparative example, the isolation characteristics were measured according to the same method as that for Examples 1 to 3. Note that, the passband of the transmitting filter 5 is 824 MHz to 849 MHz, and the passband of the receiving filter 6 is 869 MHz to 894 MHz.

Figure 19:
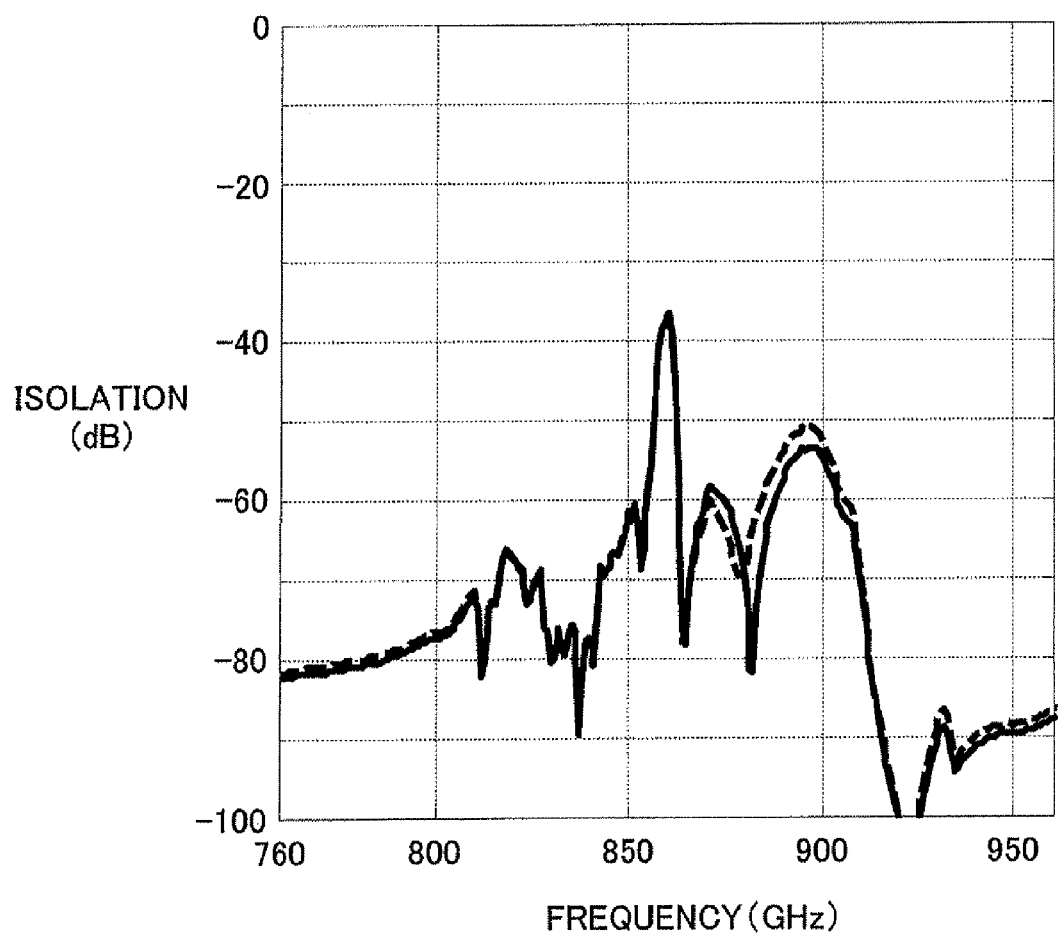
[FIG. 19] A graph showing isolation characteristics of duplexers of Example 4 and a comparative example.

The measurement results are shown in FIG. 19. The characteristic of the duplexer of Example 4 is indicated by a solid line, and the characteristic of the duplexer of the comparative example is indicated by a broken line.

As shown in FIG. 19, in the passband on the reception side (869 MHz to 894 MHz), the isolation characteristic of the duplexer of the comparative example is 51.5 dB. In contrast, the isolation characteristic of the duplexer of Example 4 is 54.0 dB. Namely, the duplexer of Example 4 is much improved in the isolation characteristic to 2.5 dB in comparison with the duplexer of the comparative example. Accordingly, it was confirmed that the isolation characteristic could be improved by disposing the second electromagnetic coupling element 9 (second wiring pattern 28').

Reference Signs List
- 1 ... transmission side signal terminal (first terminal)
- 2, 3 ... reception side signal terminals (second terminals)
- 4 ... antenna terminal (antenna terminal)
- 5 ... transmitting filter (first filter)
- 6 ... receiving filter (second filter)
- 8 ... electromagnetic coupling element

The invention claimed is:

1. A duplexer, comprising:
   a ladder type first filter located between an antenna terminal and a first terminal, and having a parallel resonator between a line for connecting the antenna terminal and the first terminal and a ground part;
   a second filter located between the antenna terminal and a second terminal, and having a passband higher than a passband of the first filter;
   a first electromagnetic coupling element located on an opposite side of the line with respect to the parallel resonator and between the parallel resonator of the first filter and the ground part, and electromagnetically coupled with a portion of a wiring pattern connecting the antenna terminal and the first filter; and
   a second electromagnetic coupling element electrically connected to the parallel resonator of the first filter and electromagnetically coupled with the antenna terminal.

2. The duplexer according to claim 1, wherein at least one of the first filter and the second filter comprises a surface acoustic wave filter.

3. The duplexer according to claim 1, wherein at least one of the first filter and the second filter comprises a thin film bulk acoustic resonator.

4. The duplexer according to claim 1, wherein the first filter further comprises a transmitting filter, the second filter comprises a receiving filter, and the second terminal comprises a balanced signal terminal.

5. A communication module component, comprising:
   a module board, and
   a duplexer according to claim 1 on the module board.

6. A communication device, comprising:
   an antenna;
   an RF circuit comprising a duplexer according to claim 1, and connected to the antenna;
   an IF circuit connected to the RF circuit;
   a signal processing circuit connected to the IF circuit; and
   an interface part connected to the signal processing circuit.

7. A duplexer, comprising:
   a circuit board;
   an antenna terminal, a first terminal, a second terminal, and a ground part which are located on a first surface of the circuit board;
   a piezoelectric substrate mounted on a second surface of the circuit board opposite to the first surface;
   a ladder type first filter which is located on a mount surface of the piezoelectric substrate, the mount surface being for mounting on the circuit board, and has a parallel resonator between a line for connecting the antenna terminal and the first terminal and the ground part;
   a second filter located on the mount surface of the piezoelectric substrate, and having a passband higher than a passband of the first filter; and
   a first wiring pattern provided in the circuit board, the first wiring pattern having a first end connected to the parallel resonator, and having a second end connected to the ground part, the first wiring pattern being on an opposite side of the line with respect to the parallel resonator and between the parallel resonator and the ground part, wherein a portion of the first wiring pattern and a portion of a wiring pattern connecting the antenna terminal and the first filter are arranged with no other conductor interposed therebetween.

8. The duplexer according to claim 7, further comprising a second wiring pattern having a first end connected to the first wiring pattern and having a second end not connected to another conductor, wherein a portion of the second wiring pattern and the antenna terminal are arranged with no other wiring line interposed therebetween.

* * * * *